US009860983B2

(12) United States Patent
Kurihara et al.

(10) Patent No.: US 9,860,983 B2
(45) Date of Patent: Jan. 2, 2018

(54) METHOD FOR PRODUCING SILVER NANOPARTICLES, SILVER NANOPARTICLES, AND SILVER COATING COMPOSITION

(71) Applicants: NATIONAL UNIVERSITY CORPORATION YAMAGATA UNIVERSITY, Yamagata-shi, Yamagata (JP); DAICEL CORPORATION, Osaka-shi, Osaka (JP)

(72) Inventors: Masato Kurihara, Yamagata (JP); Kazuki Okamoto, Himeji (JP); Yuki Iguchi, Himeji (JP)

(73) Assignees: NATIONAL UNIVERSITY CORPORATION YAMAGATA UNIVERSITY, Yamagata-shi (JP); DAICEL CORPORATION, Osaka-shi (JP)

( * ) Notice: Subject to any disclaimer, the term of this patent is extended or adjusted under 35 U.S.C. 154(b) by 0 days.

(21) Appl. No.: 14/371,462

(22) PCT Filed: Jan. 7, 2013

(86) PCT No.: PCT/JP2013/050048
§ 371 (c)(1),
(2) Date: Jul. 10, 2014

(87) PCT Pub. No.: WO2013/105530
PCT Pub. Date: Jul. 18, 2013

(65) Prior Publication Data
US 2015/0001452 A1    Jan. 1, 2015

(30) Foreign Application Priority Data
Jan. 11, 2012 (JP) ................................. 2012-002895

(51) Int. Cl.
*H01B 1/02* (2006.01)
*H01B 1/22* (2006.01)
(Continued)

(52) U.S. Cl.
CPC ........... *H05K 1/097* (2013.01); *B22F 1/0018* (2013.01); *B22F 1/0022* (2013.01);
(Continued)

(58) Field of Classification Search
CPC ... H01B 1/22; H01B 1/02; H05K 3/12; H05K 3/1283; H05K 1/097; C09D 11/52;
(Continued)

(56) References Cited

U.S. PATENT DOCUMENTS 7,081,214 B2 *   7/2006  Matsuba et al. .............. 252/512
7,270,694 B2 *   9/2007  Li et al. ........................ 75/351
(Continued)

FOREIGN PATENT DOCUMENTS

JP    2007-39718 A    2/2007
JP    2008-81814 A    4/2008
(Continued)

OTHER PUBLICATIONS

English translation of International Preliminary Report on Patentability and Written Opinion dated Jul. 24, 2014, in PCT International Application No. PCT/JP2013/050048.
(Continued)

*Primary Examiner* — Mark Kopec
*Assistant Examiner* — Matthew R Diaz
(74) *Attorney, Agent, or Firm* — Birch, Stewart, Kolasch & Birch, LLP

(57) ABSTRACT

The present invention provides silver nano-particles with excellent stability and conductivity by low-temperature calcining, a producing method for same, and a silver coating composition. A method for producing silver nano-particles
(Continued)

50nm comprising: preparing an amine mixture liquid comprising: an aliphatic hydrocarbon monoamine (A) with an aliphatic hydrocarbon group and one amino group, the aliphatic hydrocarbon group having 6 or more carbon atoms in total; an aliphatic hydrocarbon monoamine (B) with an aliphatic hydrocarbon group and one amino group, the aliphatic hydrocarbon group having 5 or less carbon atoms in total; and an aliphatic hydrocarbon diamine (C) with an aliphatic hydrocarbon group and two amino groups, the aliphatic hydrocarbon group having 8 or less carbon atoms in total; mixing a silver compound and the amine mixture liquid to form a complex compound; and thermally decomposing the complex compound by heating to form silver nano-particles.

12 Claims, 1 Drawing Sheet

(51) Int. Cl.

| | | |
|---|---|---|
| *C09D 5/24* | (2006.01) | |
| *C09D 7/12* | (2006.01) | |
| *C09D 11/52* | (2014.01) | |
| *H05K 1/09* | (2006.01) | |
| *B22F 1/00* | (2006.01) | |
| *B22F 9/30* | (2006.01) | |
| *B82Y 30/00* | (2011.01) | |
| *B82Y 40/00* | (2011.01) | |
| *B22F 7/04* | (2006.01) | |
| *H05K 3/12* | (2006.01) | |

(52) U.S. Cl.
CPC .......... *B22F 1/0062* (2013.01); *B22F 1/0074* (2013.01); *B22F 9/30* (2013.01); *C09D 5/24* (2013.01); *C09D 7/1266* (2013.01); *C09D 11/52* (2013.01); *H01B 1/02* (2013.01); *H01B 1/22* (2013.01); *B22F 7/04* (2013.01); *B22F 2007/047* (2013.01); *B22F 2301/255* (2013.01); *B82Y 30/00* (2013.01); *B82Y 40/00* (2013.01); *H05K 3/12* (2013.01)

(58) Field of Classification Search
CPC ........ C09D 5/24; B22F 1/0018; B22F 1/0022; B22F 1/0062; B22F 1/0074
See application file for complete search history.

(56) References Cited

U.S. PATENT DOCUMENTS

| | | | | |
|---|---|---|---|---|
| 7,357,884 | B2* | 4/2008 | Fujii et al. | 252/514 |
| 8,021,580 | B2* | 9/2011 | Ueda et al. | 252/513 |
| 8,057,849 | B2* | 11/2011 | Liu et al. | 427/71 |
| 2005/0285084 | A1 | 12/2005 | Fujii et al. | |
| 2009/0148600 | A1* | 6/2009 | Li et al. | 427/256 |
| 2009/0214764 | A1* | 8/2009 | Li | B22F 1/0018 427/98.4 |
| 2010/0037731 | A1* | 2/2010 | Li | B22F 1/0018 75/370 |
| 2010/0065789 | A1* | 3/2010 | Sato | 252/514 |
| 2011/0135808 | A1 | 6/2011 | Liu et al. | |
| 2012/0043510 | A1 | 2/2012 | Kurihara et al. | |

FOREIGN PATENT DOCUMENTS

| | | |
|---|---|---|
| JP | 2008-161907 A | 7/2008 |
| JP | 2008-214695 A | 9/2008 |
| JP | 2010-265543 A | 11/2010 |
| JP | 2011-68936 A | 4/2011 |
| WO | WO 2010/119630 A1 | 10/2010 |

OTHER PUBLICATIONS

International Search Report for PCT/JP2013/050048 dated Apr. 2, 2013.
Written Opinion of the International Searching Authority for PCT/JP2013/050048 dated Apr. 2, 2013.
Extended European Search Report, dated Jan. 5, 2016, for corresponding European Application No. 13735901.4.
Japanese Office Action, dated Nov. 10, 2015, for Japanese Application No. 2012-002895.

* cited by examiner

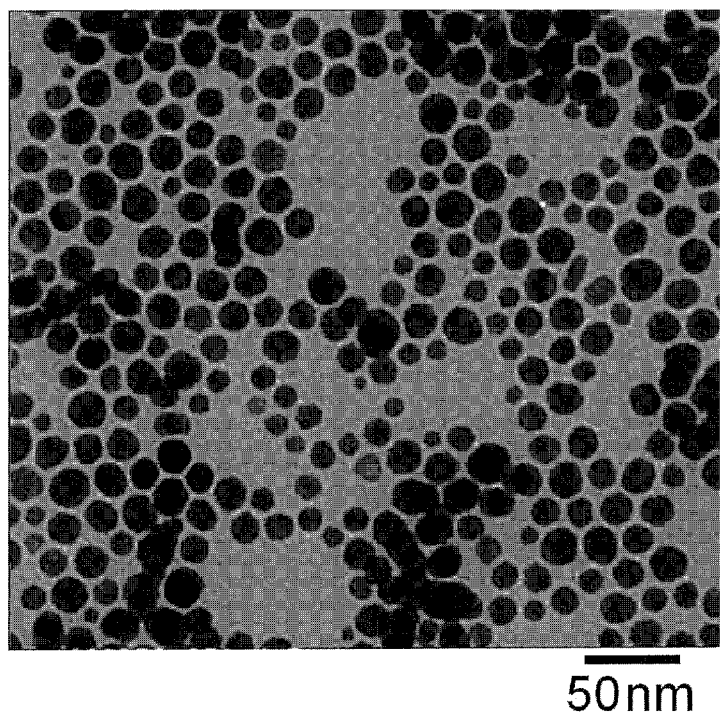

METHOD FOR PRODUCING SILVER NANOPARTICLES, SILVER NANOPARTICLES, AND SILVER COATING COMPOSITION

TECHNICAL FIELD

The present invention relates to a method for producing silver nano-particles and silver nano-particles. The present invention also relates to a silver coating composition containing the silver nano-particles. The present invention is applied also to a method for producing metal nano-particles containing a metal other than silver and metal nano-particles.

BACKGROUND ART

Silver nano-particles can be sintered even at a low temperature. Utilizing this property, a silver coating composition containing silver nano-particles is used to form electrodes or conductive circuit patterns on a substrate in production of various electronic devices. Silver nano-particles are usually dispersed in an organic solvent. Silver nano-particles have an average primary particle diameter of about several nanometers to about several tens of nanometers, and their surfaces are usually coated with an organic stabilizer (protective agent). When the substrate is a plastic film or sheet, silver nano-particles need to be sintered at a low temperature (e.g., at 200° C. or less) less than a heat resistant temperature of the plastic substrate.

Particularly, attempts have been recently made to form fine metal lines (e.g., silver lines) not only on heat-resistant polyimide substrates that are already in use as substrates for flexible printed circuit boards but also on substrates made of various plastics, such as PET (polyethylene terephthalate) and polypropylene, that have lower heat resistance than polyimide but can be easily processed and are cheap. When plastic substrates having low heat resistance are used, metal nano-particles (e.g., silver nano-particles) need to be sintered at a lower temperature.

For example, JP-A-2008-214695 discloses a method for producing silver ultrafine particles, comprising reacting silver oxalate and oleylamine to form a complex compound containing at least silver, oleylamine and an oxalate ion; and thermally decomposing the formed complex compound to form silver ultrafine particles (claim 1). Further, JP-A-2008-214695 discloses that in the above method, a saturated aliphatic amine having 1 to 18 carbon atoms in total is reacted in addition to the silver oxalate and the oleylamine (claims 2 and 3), so that a complex compound can be easily formed, the time required to produce silver ultrafine particles can be reduced, and the silver ultrafine particles protected by these amines can be formed in higher yield (paragraph [0011]).

JP-A-2010-265543 discloses a method for producing coated silver ultrafine particles, comprising the first step of mixing a silver compound that is decomposed by heating to generate metallic silver, a mid- to short-chain alkylamine having a boiling point of 100° C. to 250° C., and a mid- to short-chain alkyldiamine having a boiling point of 100° C. to 250° C. to prepare a complex compound containing the silver compound, the alkylamine and the alkyldiamine; and the second step of thermally decomposing the complex compound (claim 3, paragraphs [0061] and [0062]).

PRIOR ART DOCUMENTS

Patent Documents

Patent Document 1: JP-A-2008-214695
Patent Document 2: JP-A-2010-265543

SUMMARY OF THE INVENTION

Problems to be Solved by the Invention

Silver nano-particles have an average primary particle diameter of about several nanometers to about several tens of nanometers, and are more likely to agglomerate than micron (μm)-size particles. Therefore, the reduction reaction of a silver compound (thermal decomposition reaction in the above patent documents) is performed in the presence of an organic stabilizer (protective agent such as an aliphatic amine or an aliphatic carboxylic acid) so that the surfaces of resulting silver nano-particles are coated with the organic stabilizer.

Meanwhile, silver nano-particles are used in a silver coating composition (silver ink or silver paste) in which the particles are contained in an organic solvent. In order to development conductivity, an organic stabilizer coating the silver nano-particles needs to be removed during calcining performed after application of the silver coating composition onto a substrate to sinter the silver particles. When the temperature of the calcining is low, the organic stabilizer is poorly removed. When the silver particles are not sufficiently sintered, a low resistance value cannot be achieved. That is, the organic stabilizer present on the surfaces of the silver nano-particles contributes to the stabilization of the silver nano-particles, but on the other hand, interferes with the sintering of the silver nano-particles (especially, sintering by low-temperature calcining).

The use of an aliphatic amine compound and/or an aliphatic carboxylic acid compound each having a relatively long chain (e.g., 8 or more carbon atoms) as an organic stabilizer makes it easy to stabilize silver nano-particles because it is easy to ensure space between the silver nano-particles. On the other hand, the long-chain aliphatic amine compound and/or the long-chain aliphatic carboxylic acid compound are/is poorly removed when the temperature of calcining is low.

As described above, the relationship between the stabilization of silver nano-particles and the development of a low resistance value by low-temperature calcining is a trade-off.

As described above, in JP-A-2008-214695, oleylamine having 18 carbon atoms and a saturated aliphatic amine having 1 to 18 carbon atoms are used in combination as aliphatic amine compounds. However, the use of oleylamine as a main ingredient of a protective agent inhibits sintering of silver nano-particles during low-temperature calcining. Further, the reaction rate of forming a complex compound of oleylamine and silver oxalate is not satisfactory.

As described above, in JP-A-2010-265543, a mid- to short-chain alkylamine having a boiling point of 100° C. to 250° C. (paragraph [0061]) and a mid- to short-chain alkyldiamine having a boiling point of 100° C. to 250° C. (paragraph [0062]) are used in combination as aliphatic amine compounds. This method improves the problem resulting from the use of oleylamine as a main ingredient of a protective agent. However, it is desired that the production process of silver nano-particles or the performance of resulting silver nano-particles (development of a low resistance value by low-temperature calcining) is further improved.

It is therefore an object of the present invention to provide silver nano-particles that are excellent in stability and develop excellent conductivity (low resistance value) by low-temperature calcining, especially silver nano-particles that develop conductivity (low resistance value) even when a calcined silver film having a thickness of, for example, 1 μm or more is formed by low-temperature calcining, and a method for producing the silver nano-particles. It is also an object of the present invention to provide a silver coating composition comprising the silver nano-particles.

Means for Solving the Problems

The present inventors have studied aliphatic amine compounds that function as a complex-forming agent and/or a protective agent, and have found a method capable of obtaining silver nano-particles that are excellent in stability and develop excellent conductivity (low resistance value) even when a silver coating film having a relatively large thickness of, for example, 1 μm or more is formed by calcining at a low temperature of 200° C. or less (e.g., 150° C. or less, preferably 120° C. or less) and for a short time of 2 hours or less (e.g., 1 hour or less, preferably 30 minutes or less).

The present invention includes the following aspects.

(1) A method for producing silver nano-particles comprising:

preparing an amine mixture liquid comprising:

an aliphatic hydrocarbon monoamine (A) comprising an aliphatic hydrocarbon group and one amino group, said aliphatic hydrocarbon group having 6 or more carbon atoms in total;

an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total;

mixing a silver compound and the amine mixture liquid to form a complex compound comprising the silver compound and the amines; and thermally decomposing the complex compound by heating to form silver nano-particles.

(2) The method for producing silver nano-particles according to the above (1), wherein the aliphatic hydrocarbon monoamine (A) is an alkylmonoamine having 6 or more and 12 or less carbon atoms.

(3) The method for producing silver nano-particles according to the above (1) or (2), wherein the aliphatic hydrocarbon monoamine (B) is an alkylmonoamine having 2 or more and 5 or less carbon atoms.

(4) The method for producing silver nano-particles according to any one of the above (1) to (3), wherein the aliphatic hydrocarbon monoamine (B) is a butylamine.

(5) The method for producing silver nano-particles according to any one of the above (1) to (4), wherein the silver compound is silver oxalate.

(6) The method for producing silver nano-particles according to any one of the above (1) to (5), wherein the aliphatic hydrocarbon monoamine (A) is contained in the amine mixture liquid in an amount of 10 mol % to 65 mol % of a total of the monoamine (A), the monoamine (B), and the diamine (C).

(7) The method for producing silver nano-particles according to any one of the above (1) to (6), wherein the aliphatic hydrocarbon monoamine (B) is contained in the amine mixture liquid in an amount of 5 mol % to 50 mol % of a total of the monoamine (A), the monoamine (B), and the diamine (C).

(8) The method for producing silver nano-particles according to any one of the above (1) to (7), wherein the aliphatic hydrocarbon diamine (C) is contained in the amine mixture liquid in an amount of 15 mol % to 50 mol % of a total of the monoamine (A), the monoamine (B), and the diamine (C).

(9) The method for producing silver nano-particles according to any one of the above (1) to (8), wherein the monoamine (A), the monoamine (B), and the diamine (C) are used in a total amount of 1 to 20 moles per mole of silver atoms in the silver compound.

(10) The method for producing silver nano-particles according to any one of the above (1) to (9), wherein the amine mixture liquid further contains an aliphatic carboxylic acid (D).

(11) Silver nano-particles produced by the method according to any one of the above (1) to (10).

Coated silver nano-particles whose surfaces are coated with a protective agent, wherein the protective agent comprises the aliphatic hydrocarbon monoamine (A) having 6 or more carbon atoms in total, the aliphatic hydrocarbon monoamine (B) having 5 or less carbon atoms in total, and the aliphatic hydrocarbon diamine (C) having 8 or less carbon atoms in total.

Coated silver nano-particles whose surfaces are coated with a protective agent, wherein the protective agent comprises the aliphatic hydrocarbon monoamine (A) having 6 or more carbon atoms in total, the aliphatic hydrocarbon monoamine (B) having 5 or less carbon atoms in total, the aliphatic hydrocarbon diamine (C) having 8 or less carbon atoms in total, and the aliphatic carboxylic acid (D).

(12) A silver coating composition comprising silver nano-particles produced by the method according to any one of the above (1) to (10), and an organic solvent. The silver coating composition may take any form without any limitation. For example, a silver coating composition in which the silver nano-particles are dispersed in suspension state in the organic solvent, or a silver coating composition in which the silver nano-particles are dispersed in kneaded state in the organic solvent.

(13) A silver conductive material comprising:

a substrate, and a silver conductive layer obtained by applying, onto the substrate, a silver coating composition comprising silver nano-particles produced by the method according to any one of the above (1) to (10) and an organic solvent, and calcining the silver coating composition. The calcining is performed at a temperature of 200° C. or less, for example, 150° C. or less, preferably 120° C. or less, for 2 hours or less, for example, 1 hour or less, preferably 30 minutes or less.

(14) The silver conductive material according to the above (13), wherein the silver conductive layer is patterned.

(15) A method for producing a silver conductive material comprising:

applying, onto a substrate, a silver coating composition comprising silver nano-particles produced by the method according to any one of the above (1) to (10) and an organic solvent, and then, calcining the silver coating composition to form a silver conductive layer. The calcining is performed at a temperature of 200° C. or less, for example, 150° C. or less, preferably 120° C. or less, for 2 hours or less, for example, 1 hour or less, preferably 30 minutes or less.

(16) The method for producing a silver conductive material according to the above (15), wherein the silver coating composition is applied in a pattern, and is then calcined to form a patterned silver conductive layer.

A method for producing metal nano-particles comprising:
preparing an amine mixture liquid comprising:
an aliphatic hydrocarbon monoamine (A) comprising an aliphatic hydrocarbon group and one amino group, said aliphatic hydrocarbon group having 6 or more carbon atoms in total;
an aliphatic hydrocarbon monoamine (B) comprising an aliphatic hydrocarbon group and one amino group, said aliphatic hydrocarbon group having 5 or less carbon atoms in total; and
an aliphatic hydrocarbon diamine (C) comprising an aliphatic hydrocarbon group and two amino groups, said aliphatic hydrocarbon group having 8 or less carbon atoms in total;
mixing a metal compound and the amine mixture liquid to form a complex compound comprising the metal compound and the amines; and
thermally decomposing the complex compound by heating to form metal nano-particles.

Coated metal nano-particles whose surfaces are coated with a protective agent, wherein the protective agent comprises the aliphatic hydrocarbon monoamine (A) having 6 or more carbon atoms in total, the aliphatic hydrocarbon monoamine (B) having 5 or less carbon atoms in total, and the aliphatic hydrocarbon diamine (C) having 8 or less carbon atoms in total.

Coated metal nano-particles whose surfaces are coated with a protective agent, wherein the protective agent comprises the aliphatic hydrocarbon monoamine (A) having 6 or more carbon atoms in total, the aliphatic hydrocarbon monoamine (B) having 5 or less carbon atoms in total, the aliphatic hydrocarbon diamine (C) having 8 or less carbon atoms in total, and the aliphatic carboxylic acid (D).

A metal coating composition comprising the coated metal nano-particles and an organic solvent. The metal coating composition may take any form without any limitation. For example, a metal coating composition in which the metal nano-particles are dispersed in suspension state in the organic solvent, or a metal coating composition in which the metal nano-particles are dispersed in kneaded state in the organic solvent.

Effects of the Invention

In the present invention, as aliphatic amine compounds that function as a complex-forming agent and/or a protective agent, an aliphatic hydrocarbon monoamine (A) having 6 or more carbon atoms in total, an aliphatic hydrocarbon monoamine (B) having 5 or less carbon atoms in total, and an aliphatic hydrocarbon diamine (C) having 8 or less carbon atoms in total are used.

The aliphatic hydrocarbon diamine (C) having 8 or less carbon atoms in total has a high ability to coordinate to silver in a silver compound, and therefore has the effect of promoting complex formation. Further, the aliphatic hydrocarbon diamine (C) also has the effect of promoting thermal decomposition of a resulting complex. The aliphatic hydrocarbon monoamine (B) having 5 or less carbon atoms in total has a shorter carbon chain than the aliphatic hydrocarbon monoamine (A) having 6 or more carbon atoms in total, and therefore the function of the aliphatic hydrocarbon monoamine (B) itself as a protective agent (stabilizer) is considered to be lower. However, the aliphatic hydrocarbon monoamine (B) has a high ability to coordinate to silver in a silver compound due to its higher polarity than the aliphatic hydrocarbon monoamine (A), and is therefore considered to have the effect of promoting complex formation.

The aliphatic hydrocarbon monoamine (A) having 6 or more carbon atoms in total has high performance as a protective agent (stabilizer) to protect the surfaces of resulting silver particles. Further, part of the surfaces of the silver particles, to which the aliphatic hydrocarbon monoamine (A) is not attached, is coated with the aliphatic hydrocarbon monoamine (B) having 5 or less carbon atoms in total and the aliphatic hydrocarbon diamine (C) having 8 or less carbon atoms in total attached thereto. That is, the function of the aliphatic hydrocarbon monoamine (B) and the aliphatic hydrocarbon diamine (C) themselves as a protective agent is considered to be low, but the aliphatic hydrocarbon monoamine (B) and the aliphatic hydrocarbon diamine (C) are considered to play a role in coating part of the surfaces of the silver particles to assist the function of the aliphatic hydrocarbon monoamine (A) as a protective agent. Therefore, silver nano-particles can be properly stabilized even when the amount of the aliphatic hydrocarbon monoamine (A) having 6 or more carbon atoms in total attached to the surfaces of the silver particles is reduced.

As described above, the step of forming a complex compound can be efficiently performed, and stabilized silver nano-particles can be efficiently produced.

The aliphatic hydrocarbon monoamine (B) having 5 or less carbon atoms in total and the aliphatic hydrocarbon diamine (C) having 8 or less carbon atoms in total each have a short carbon chain, and are therefore easily removed from the surfaces of the silver particles in a short time of 2 hours or less, for example, 1 hour or less, preferably 30 minutes or less even by low-temperature calcining at a temperature of 200° C. or less, for example, 150° C. or less, preferably 120° C. or less. In addition, the presence of the monoamine (B) and the diamine (C) reduces the amount of the aliphatic hydrocarbon monoamine (A) having 6 or more carbon atoms in total attached to the surfaces of the silver particles. This makes it possible to easily remove these aliphatic amine compounds from the surfaces of the silver particles in such a short time as described above even by low-temperature calcining at such a low temperature as described above, thereby allowing the silver particles to be sufficiently sintered.

As described above, according to the present invention, it is possible to provide silver nano-particles that have excellent stability and can develop excellent conductivity (low resistance value) by calcining at a low-temperature of 200° C. or less, for example, 150° C. or less, preferably 120° C. or less, and a short-time of 2 hours or less, for example, 1 hour or less, preferably 30 minutes or less even when having a silver film formed with a relatively large film thickness of, for example, 1 μm or more; and a method for producing such silver nano-particles. In addition, according to the present invention, it is also possible to provide a silver coating composition comprising the silver nano-particles in stable dispersion state in an organic solvent. Further, the present invention is also applied to a method for producing metal nano-particles containing a metal other than silver, and said metal nano-particles. According to the present invention, it is possible to form a conductive film or a conductive line even on any plastic substrate having low heat resistance such as a PET substrate or a polypropylene substrate.

BRIEF DESCRIPTION OF THE DRAWING

FIG. 1 is a transmission electron microscope (TEM) photograph of silver nano-particles obtained in Example 1.

MODES FOR CARRYING OUT THE INVENTION

In a method for producing silver nano-particles according to the present invention, first, an amine mixture liquid is prepared which comprises:

an aliphatic hydrocarbon monoamine (A) comprising an aliphatic hydrocarbon group and one amino group, said aliphatic hydrocarbon group having 6 or more carbon atoms in total;

an aliphatic hydrocarbon monoamine (B) comprising an aliphatic hydrocarbon group and one amino group, said aliphatic hydrocarbon group having 5 or less carbon atoms in total; and an aliphatic hydrocarbon diamine (C) comprising an aliphatic hydrocarbon group and two amino groups, said aliphatic hydrocarbon group having 8 or less carbon atoms in total. Then, a silver compound and the amine mixture liquid are mixed with each other to form a complex compound comprising the silver compound and the amines. Then, the complex compound is thermally decomposed by heating to form silver nano-particles. Thus, the method for producing silver nano-particles according to the present invention mainly includes a preparation step for an amine mixture liquid, a forming step of a complex compound, and a thermal-decomposition step of the complex compound.

In this description, the term "nano-particles" means that primary particles have a size (average primary particle diameter) of less than 1,000 nm. The particle size refers to the size of a particle not including a protective agent (a stabilizer) present on (coating) the surface of the particle (i.e., refers to the size of silver itself). In the present invention, the silver nano-particles have an average primary particle diameter of, for example, 0.5 nm to 100 nm, preferably 0.5 nm to 50 nm, more preferably 0.5 nm to 25 nm, even more preferably 0.5 nm to 10 nm.

The silver compound used in the present invention is one that is easily decomposed by heating to generate metallic silver. Examples of such a silver compound that can be used include: silver carboxylates such as silver formate, silver acetate, silver oxalate, silver malonate, silver benzoate, and silver phthalate; silver halides such as silver fluoride, silver chloride, silver bromide, and silver iodide; silver sulfate, silver nitrate, silver carbonate, and the like. In terms of the fact that metallic silver is easily generated by decomposition and impurities other than silver are less likely to be generated, silver oxalate is preferably used. Silver oxalate is advantageous in that silver oxalate has a high silver content, and metallic silver is directly obtained by thermal decomposition without the need for a reducing agent, and therefore impurities derived from a reducing agent are less likely to remain.

When metal nano-particles containing another metal other than silver are produced, a metal compound that is easily decomposed by heating to generate a desired metal is used instead of the silver compound. As such a metal compound, a metal salt corresponding to the above mentioned silver compound can be used. Examples of such a metal compound include: metal carboxylates; metal halides; and metal salt compounds such as metal sulfates, metal nitrates, and metal carbonates. Among them, in terms of the fact that a metal is easily generated by decomposition and impurities other than a metal are less likely to be generated, metal oxalate is preferably used. Examples of another metal include Al, Au, Pt, Pd, Cu, Co, Cr, In, and Ni.

Further, in order to obtain a composite with silver, the above mentioned silver compound and the above mentioned compound of another metal other than silver may be used in combination. Examples of another metal include Al, Au, Pt, Pd, Cu, Co, Cr, In, and Ni. The silver composite is composed of silver and one or more other metals, and examples thereof include Au—Ag, Ag—Cu, Au—Ag—Cu, Au—Ag—d, and the like. The amount of silver occupies at least 20 wt %, usually at least 50 wt %, for example, at least 80 wt % of the total amount of the metals.

In the present invention, as an aliphatic hydrocarbon amine compounds that function as a complex-forming agent and/or a protective agent, the aliphatic hydrocarbon amine (A) having 6 or more carbon atoms in total, the aliphatic hydrocarbon amine (B) having 5 or less carbon atoms in total, and the aliphatic hydrocarbon diamine (C) having 8 or less carbon atoms in total are used.

Although established, the "aliphatic hydrocarbon monoamine" in this description refers to a compound composed of one to three monovalent aliphatic hydrocarbon groups and one amino group. The "hydrocarbon group" refers to a group only composed of carbon and hydrogen. Each of the aliphatic hydrocarbon amine (A) and the aliphatic hydrocarbon amine (B) does not have, on its hydrocarbon group, a hetero atom (atom other than carbon and hydrogen) such as an oxygen atom or a nitrogen atom.

Further, the "aliphatic hydrocarbon diamine" refers to a compound composed of a bivalent aliphatic hydrocarbon group (alkylene group), two amino groups between which said aliphatic hydrocarbon group is interposed, and, if necessary, aliphatic hydrocarbon group(s) (alkyl group(s)) substituted for hydrogen atom (s) on the amino group(s). The aliphatic hydrocarbon amine (C) does not have, on its hydrocarbon group, a hetero atom (atom other than carbon and hydrogen) such as an oxygen atom or a nitrogen atom.

The aliphatic hydrocarbon monoamine (A) having 6 or more carbon atoms in total has, due to its hydrocarbon chain, high performance as a protective agent (a stabilizer) onto the surfaces of resulting silver particles.

The aliphatic hydrocarbon monoamine (A) includes a primary amine, a secondary amine, and a tertiary amine. Examples of the primary amine include saturated aliphatic hydrocarbon monoamines (i.e., alkylmonoamines) such as hexylamine, heptylamine, octylamine, nonylamine, decylamine, undecylamine, dodecylamine, tridecylamine, tetradecylamine, pentadecylamine, hexadecylamine, heptadecylamine, and octadecylamine. Examples of the saturated aliphatic hydrocarbon monoamine other than the above-mentioned linear aliphatic monoamines include branched aliphatic hydrocarbon amines such as isohexylamine, 2-ethylhexylamine, and tert-octylamine. Another example of the saturated aliphatic hydrocarbon monoamine includes cyclohexylamine. Other examples of the primary amine include unsaturated aliphatic hydrocarbon monoamines (i.e., alkenylmonoamines) such as oleylamine.

Examples of the secondary amine include dialkylmonoamines such as N,N-dipropylamine, N,N-dibutylamine, N,N-dipentylamine, N,N-dihexylamine, N,N-dipeptylamine, N,N-dioctylamine, N,N-dinonylamine, N,N-didecylamine, N,N-diundecylamine, N,N-didodecylamine, N-methyl-N-propylamine, N-ethyl-N-propylamine, and N-propyl-N-butylamine. Examples of the tertiary amine include tributylamine, trihexylamine, and the like.

Among them, saturated aliphatic hydrocarbon monoamines having 6 or more carbon atoms are preferred. When the number of carbon atoms is 6 or more, space can be secured between silver particles by adsorption of amino groups to the surfaces of the silver particles, thereby improving the effect of preventing agglomeration of the silver particles. The upper limit of the number of carbon atoms is not particularly limited, but saturated aliphatic monoamines having up to 18 carbon atoms are usually preferred in consideration of ease of availability, ease of removal during calcining, etc. Particularly, alkylmonoamines having 6 to 12 carbon atoms such as hexylamine, heptylamine, octylamine, nonylamine, decylamine, undecylamine, and dodecylamine are preferably used. The above-mentioned aliphatic hydrocarbon monoamines (A) may be used singly or in combination of two or more of them.

The aliphatic hydrocarbon monoamine (B) having 5 or less carbon atoms in total has a shorter carbon chain than the aliphatic monoamine (A) having 6 or more carbon atoms in total, and therefore the function of the aliphatic hydrocarbon monoamine (B) itself as a protective agent (a stabilizer) is considered to be low. However, the aliphatic hydrocarbon monoamine (B) has a high ability to coordinate to silver in the silver compound due to its higher polarity than the aliphatic monoamine (A), and is therefore considered to have the effect of promoting complex formation. In addition, the aliphatic hydrocarbon monoamine (B) has a short carbon chain, and therefore can be removed from the surfaces of silver particles in a short time of 30 minutes or less, or 20 minutes or less, even by low-temperature calcining at a temperature of, for example, 120° C. or less, or about 100° C. or less, which is effective for low-temperature calcining of resulting silver nano-particles.

Examples of the aliphatic hydrocarbon monoamine (B) include saturated aliphatic hydrocarbon monoamines (i.e., alkylmonoamines) having 2 to 5 carbon atoms such as ethylamine, n-propylamine, isopropylamine, n-butylamine, isobutylamine, sec-butylamine, tert-butylamine, pentylamine, isopentylamine, and tert-pentylamine. Other examples of the aliphatic hydrocarbon monoamine (B) include dialkylmonoamines such as N,N-dimethylamine and N,N-diethylamine.

Among them, n-butylamine, isobutylamine, sec-butylamine, tert-butylamine, pentylamine, isopentylamine, tert-pentylamine, and the like are preferred, and the above-mentioned butylamines are particularly preferred. The above-mentioned aliphatic hydrocarbon monoamines (B) may be used singly or in combination of two or more of them.

The aliphatic hydrocarbon diamine (C) having 8 or less carbon atoms in total has a high ability to coordinate to silver in the silver compound, and therefore has the effect of promoting complex formation. Generally, aliphatic hydrocarbon diamines have higher polarity than aliphatic hydrocarbon monoamines, and therefore have a high ability to coordinate to silver in a silver compound. Further, the aliphatic hydrocarbon diamine (C) has the effect of promoting lower-temperature and shorter-time thermal decomposition in the thermal-decomposition step of the complex compound, and therefore production of silver nano-particles can be more efficiently conducted. Further, a protective film containing the aliphatic diamine (C) on silver particles has high polarity, which improves the dispersion stability of the silver particles in a dispersion medium comprising a highly-polar solvent. Furthermore, the aliphatic diamine (C) has a short carbon chain, and therefore can be removed from the surfaces of silver particles in a short time of 30 minutes or less, or 20 minutes or less, even by low-temperature calcining at a temperature of, for example, 120° C. or less, or about 100° C. or less, which is effective for low-temperature and short-time calcining of resulting silver nano-particles.

The aliphatic hydrocarbon diamine (C) is not particularly limited, and examples thereof include ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-propanediamine, N,N'-dimethyl-1,3-propanediamine, N,N-diethyl-1,3-propanediamine, N,N'-diethyl-1,3-propanediamine, 1,4-butanediamine, N,N-dimethyl-1,4-butanediamine, N,N'-dimethyl-1,4-butanediamine, N,N-diethyl-1,4-butanediamine, N,N'-diethyl-1,4-butanediamine, 1,5-pentanediamine, 1,5-diamino-2-methylpentane, 1,6-hexanediamine, N,N-dimethyl-1,6-hexanediamine, N,N'-dimethyl-1,6-hexanediamine, 1,7-heptanediamine, 1,8-octanediamine, and the like. They are all alkylenediamines having 8 or less carbon atoms in total in which at least one of the two amino groups is a primary amino group or a secondary amino group, and have a high ability to coordinate to silver in the silver compound, and therefore have the effect of promoting complex formation.

Among them, N,N-dimethylethylenediamine, N,N-diethylethylenediamine, N,N-dimethyl-1,3-propanediamine, N,N-diethyl-1,3-propanediamine, N,N-dimethyl-1,4-butanediamine, N,N-diethyl-1,4-butanediamine, N,N-dimethyl-1,6-hexanediamine, and the like are preferred, which are alkylenediamines having 8 or less carbon atoms in total in which one of the two amino groups is a primary amino group ($—NH_2$) and the other is a tertiary amino group ($—NR^1R^2$). Such preferred alkylenediamines are represented by the following structural formula:

$R^1R^2N—R—NH_2$ wherein R represents a bivalent alkylene group, $R^1$ and $R^2$ may be the same or different from each other and each represent an alkyl group, and the total number of carbon atoms of R, $R^1$, and $R^2$ is 8 or less. The alkylene group does not contain a hetero atom such as an oxygen atom or a nitrogen atom. Further, the alkyl group does not contain a hetero atom such as an oxygen atom or a nitrogen atom.

When one of the two amino groups is a primary amino group, the ability to coordinate to silver in the silver compound is high, which is advantageous for complex formation, and when the other is a tertiary amino group, a resulting complex is prevented from having a complicated network structure because a tertiary amino group has a poor ability to coordinate to a silver atom. If a complex has a complicated network structure, there is a case where the thermal-decomposition step of the complex requires a high temperature. Among these diamines, those having 6 or less carbon atoms in total are preferred, and those having 5 or less carbon atoms in total are more preferred in terms of the fact that they can be removed from the surfaces of silver particles in a short time even by low-temperature calcining. The above-mentioned aliphatic hydrocarbon diamines (C) may be used singly or in combination of two or more of them.

The ratio among the aliphatic hydrocarbon monoamine (A) having 6 or more carbon atoms in total, the aliphatic hydrocarbon monoamine (B) having 5 or less carbon atoms in total, and the aliphatic hydrocarbon diamine (C) having 8 or less carbon atoms in total used in the present invention is not particularly limited. For example, the amount of the aliphatic monoamine (A) may be 10 mol % to 65 mol %;

the amount of the aliphatic monoamine (B) may be 5 mol % to 50 mol %, and the amount of the aliphatic diamine (C) may be 15 mol % to 50 mol %,
on the basis of the total amount [(A)+(B)+(C)] of the monoamine (A), the monoamine (B) and the diamine (C) in the amine mixture liquid.

By setting the content of the aliphatic monoamine (A) to 10 mol % to 65 mol %, the carbon chain of the component (A) can easily fulfill its function of protecting and stabilizing the surfaces of resulting silver particles. If the content of the component (A) is less than 10 mol %, there is a case where the protective and stabilization function is poorly developed. On the other hand, if the content of the component (A) exceeds 65 mol %, the protective and stabilization function is sufficient, but the component (A) is poorly removed by low-temperature calcining. The lower limit of the content of the component (A) is preferably 10 mol % or more, more preferably 20 mol % or more. The upper limit of the content of the component (A) is preferably 65 mol % or less, more preferably 60 mol % or less.

By setting the content of the aliphatic monoamine (B) to 5 mol % to 50 mol %, the effect of promoting complex formation is easily obtained, the aliphatic monoamine (B) itself can contribute to low-temperature and short-time calcining, and the effect of facilitating the removal of the aliphatic diamine (C) from the surfaces of silver particles during calcining is easily obtained. If the content of the component (B) is less than 5 mol %, there is a case where the effect of promoting complex formation is poor, or the component (C) is poorly removed from the surfaces of silver particles during calcining. On the other hand, if the content of the component (B) exceeds 50 mol %, the effect of promoting complex formation is obtained, but the content of the aliphatic monoamine (A) is relatively reduced so that the surfaces of resulting silver particles are poorly protected and stabilized. The lower limit of the content of the component (B) is preferably 10 mol % or more, more preferably 15 mol % or more. The upper limit of the content of the component (B) is preferably 45 mol % or less, more preferably 40 mol % or less.

By setting the content of the aliphatic diamine (C) to 15 mol % to 50 mol %, the effect of promoting complex formation and the effect of promoting the thermal-decomposition of the complex are easily obtained, and further, the dispersion stability of silver particles in a dispersion medium containing a highly-polar solvent is improved because a protective film containing the aliphatic diamine (C) on silver particles has high polarity. If the content of the component (C) is less than 15 mol %, there is a case where the effect of promoting complex formation and the effect of promoting the thermal-decomposition of the complex are poor. On the other hand, if the content of the component (C) exceeds 50 mol %, the effect of promoting complex formation and the effect of promoting the thermal-decomposition of the complex are obtained, but the content of the aliphatic monoamine (A) is relatively reduced so that the surfaces of resulting silver particles are poorly protected and stabilized. The lower limit of the content of the component (C) is preferably 15 mol % or more, more preferably 20 mol % or more. The upper limit of the content of the component (C) is preferably 45 mol % or less, more preferably 40 mol % or less.

In the present invention, the use of the aliphatic monoamine (B) and the aliphatic diamine (C) each having a high ability to coordinate to silver in the silver compound makes it possible, depending on their contents, to reduce the amount of the aliphatic monoamine (A) having 6 or more carbon atoms in total adhered to the surfaces of silver particles. Therefore, these aliphatic amine compounds are easily removed from the surfaces of silver particles even by the above-described low-temperature and short-time calcining so that the silver particles are sufficiently sintered.

In the present invention, the total amount of the monoamine (A), the monoamine (B) and the diamine (C) is not particularly limited, but may be about 1 to 20 moles as represented by the total amount of the amine components [(A)+(B)+(C)], per 1 mole of silver atoms in the silver compound as a starting material. If the total amount of the amine components [(A)+(B)+(C)] is less than 1 mole per 1 mole of the silver atoms, there is a possibility that part of the silver compound remains without being converted to a complex compound in the complex compound-forming step so that, in the subsequent thermal decomposition step, silver particles have poor uniformity and become enlarged or the silver compound remains without being thermally decomposed. On the other hand, it is considered that even when the total amount of the amine components [(A)+(B)+(C)] exceeds about 20 moles per 1 mole of the silver atoms, there are few advantages. In order to produce a dispersion liquid of silver nano-particles in substantial non-solvent reaction system, the total amount of the amine components [(A)+(B)+(C)] may be, for example, about 2 moles or more per 1 mole of the silver atoms. By setting the total amount of the amine components to about 2 to 20 moles, the complex compound-forming step and the thermal-decomposition step of the complex compound can be successfully performed. The lower limit of the total amount of the amine components is preferably 2 moles or more, more preferably 6 moles or more per 1 mole of silver atoms in the silver compound.

In the present invention, an aliphatic carboxylic acid (D) may further be used as a stabilizer to further improve the dispersibility of silver nano-particles in a dispersion medium. The aliphatic carboxylic acid (D) may be used by adding to the liquid amine mixture. The use of the aliphatic carboxylic acid (D) may improve the stability of silver nano-particles, especially the stability of silver nano-particles in a coating material state where the silver nano-particles are dispersed in an organic solvent.

As the aliphatic carboxylic acid (D), a saturated or unsaturated aliphatic carboxylic acid is used. Examples of the aliphatic carboxylic acid include saturated aliphatic monocarboxylic acids having 4 or more carbon atoms such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, icosanoic acid, and eicosenoic acid; and unsaturated aliphatic monocarboxylic acids having 8 or more carbon atoms such as oleic acid, elaidic acid, linoleic acid, and palmitoleic acid.

Among them, saturated or unsaturated aliphatic monocarboxylic acids having 8 to 18 carbon atoms are preferred. When the number of carbon atoms is 8 or more, space can be secured between silver particles by adsorption of carboxylic groups to the surfaces of the silver particles, thereby improving the effect of preventing agglomeration of the silver particles. In consideration of ease of availability, ease of removal during calcining, etc., saturated or unsaturated aliphatic monocarboxylic compounds having up to 18 carbon atoms are usually preferred. Particularly, octanoic acid, oleic acid, and the like are preferably used. The above-mentioned aliphatic carboxylic acids (D) may be used singly or in combination of two or more of them.

When the aliphatic carboxylic acid (D) is used, the amount of the aliphatic carboxylic acid (D) used may be, for example, about 0.05 to 10 moles, preferably 0.1 to 5 moles, more preferably 0.5 to 2 moles per 1 mole of silver atoms in the silver compound as a starting material. If the amount of the component (D) is less than 0.05 moles per 1 mole of the silver atoms, the effect of improving dispersion stability obtained by adding the component (D) is poor. On the other hand, if the amount of the component (D) reaches 10 moles, the effect of improving dispersion stability is saturated and the component (D) is poorly removed by low-temperature calcining. It is to be noted that the aliphatic carboxylic acid (D) does not necessarily need to be used.

In the present invention, first, an amine mixture liquid containing the aliphatic hydrocarbon monoamine (A) having 6 or more carbon atoms in total, the aliphatic hydrocarbon monoamine (B) having 5 or less carbon atoms in total, and the aliphatic hydrocarbon diamine (C) having 8 or less carbon atoms in total is prepared [preparation step for amine mixture liquid].

The amine mixture liquid can be prepared by stirring the amine component (A), the amine component (B), and the amine component (C), and if used, the carboxylic acid component (D) in a given ratio at a room temperature.

Then, the amine mixture liquid containing the amine component (A), the amine component (B), and the amine component (C) is mixed with the silver compound to form a complex compound containing the silver compound and the amines (complex compound-forming step). When metal nano-particles containing another metal other than silver are produced, a metal compound containing a desired metal is used instead of the silver compound.

The silver compound (or the metal compound) in powder form, and a given amount of the amine mixture liquid are mixed. At this time, the mixing may be performed by stirring them at a room temperature, or may be performed by stirring them while a mixture of them is appropriately cooled to a room temperature or less because the coordination reaction of the amines to the silver compound (or the metal compound) is accompanied by heat generation. The excess amines function as a reaction medium. When a complex compound is formed, the formed complex compound generally exhibits a color corresponding to its components, and therefore the endpoint of a complex compound-forming reaction can be determined by detecting the end of a change in the color of a reaction mixture by an appropriate spectroscopic method or the like. A complex compound formed from silver oxalate is generally colorless (appears white to our eyes), but even in such a case, it is possible to determine the state of formation of a complex compound based on a change in the form of a reaction mixture such as a change in viscosity. In this way, a silver-amine complex (or a metal-amine complex) is obtained in a medium mainly containing the amines.

Then, the obtained complex compound is thermally decomposed by heating to form silver nano-particles [thermal-decomposition step of complex compound]. When a metal compound containing another metal other than silver is used, desired metal nano-particles are formed. The silver nano-particles (metal nano-particles) are formed without using a reducing agent. However, if necessary, an appropriate reducing agent may be used without impairing the effects of the present invention.

In such a metal-amine complex decomposition method, the amines generally play a role in controlling the mode of formation of fine particles by agglomeration of an atomic metal generated by decomposition of the metal compound, and in forming film on the surfaces of the formed metal fine particles to prevent reagglomeration of the fine particles.

That is, it is considered that when the complex compound of the metal compound and the amine is heated, the metal compound is thermally decomposed to generate an atomic metal while the coordination bond of the amine to a metallic atom is maintained, and then the metallic atoms coordinated with the amine are agglomerated to form metal nano-particles coated with an amine protective film.

At this time, the thermal decomposition is preferably performed by stirring the complex compound in a reaction medium mainly containing the amines. The thermal decomposition may be performed in a temperature range in which coated silver nano-particles (or coated metal nano-particles) are formed, but from the viewpoint of preventing the elimination of the amine from the surfaces of silver particles (or from the surfaces of metal particles), the thermal decomposition is preferably performed at a temperature as low as possible within such a temperature range. In case of the complex compound from silver oxalate, the thermal decomposition temperature may be, for example, about 80° C. to 120° C., preferably about 95° C. to 115° C., more specifically about 100° C. to 110° C. In case of the complex compound from silver oxalate, heating at about 100° C. allows decomposition and reduction of silver ions to occur so that coated silver nano-particles can be obtained. Further, the thermal decomposition of silver oxalate itself generally occurs at about 200° C. The reason why the thermal decomposition temperature of a silver oxalate-amine complex compound is about 100° C. lower than that of silver oxalate itself is not clear, but it is estimated that a coordination polymer structure formed by pure silver oxalate is broken by forming a complex compound of silver oxalate with the amine.

Further, the thermal decomposition of the complex compound is preferably performed in an inert gas atmosphere such as argon, but may be performed in the atmosphere.

When the complex compound is thermally decomposed, a suspension exhibiting a glossy blue color is obtained. Then, the excess amines, etc. are removed from the suspension by, for example, sedimentation of silver nano-particles (or metal nano-particles) and decantation and washing with an appropriate solvent (water or an organic solvent) to obtain desired stable coated silver nano-particles (or coated metal nano-particles). After the washing, the coated silver nano-particles are dried to obtain a powder of the desired stable coated silver nano-particles (or coated metal nano-particles).

The decantation and washing are performed using water or an organic solvent. Examples of the organic solvent that may be used include aliphatic hydrocarbon solvents such as pentane, hexane, heptane, octane, nonane, decane, undecane, dodecane, tridecane, and tetradecane; aromatic hydrocarbon solvents such as toluene, xylene, and mesitylene; alcohol solvents such as methanol, ethanol, propanol, and butanol; acetonitrile; and mixed solvents of them.

The method according to the present invention does not require the use of a reducing agent. Therefore, a by-product derived from a reducing agent is not formed, coated silver nano-particles are easily separated from a reaction system, and high-purity coated silver nano-particles are obtained. However, if necessary, an appropriate reducing agent may be used without impairing the effects of the present invention.

A silver coating composition can be prepared using the obtained silver nano-particles. The silver coating composition can take any form without any limitation. For example, a silver coating composition called "silver ink" can be prepared by dispersing the silver nano-particles in suspension state in an appropriate organic solvent (dispersion medium). Alternatively, a silver coating composition called "silver paste" can be prepared by dispersing the silver nano-particles in kneaded state in an organic solvent. Examples of the organic solvent used to obtain the coating composition include: aliphatic hydrocarbon solvents such as pentane, hexane, heptane, octane, nonane, decane, undecane, dodecane, tridecane, and tetradecane; aromatic hydrocarbon solvents such as toluene, xylene, and mesitylene; and alcohol solvents such as methanol, ethanol, propanol, n-butanol, n-pentanol, n-hexanol, n-heptanol, n-octanol, n-nonanol, and n-decanol. The kind and amount of organic solvent used may be appropriately determined depending on a desired concentration or viscosity of the silver coating composition. The same goes for the metal nano-particles.

The silver nano-particle powder and the silver coating composition obtained in the present invention have excellent stability. For example, the silver nano-particle powder is stable during storage at a room temperature for 1 month or more. The silver coating composition is stable at a silver concentration of, for example, 50 wt % at a room temperature for 1 month or more without the occurrence of agglomeration and fusion.

According to the present invention, silver nano-particles (or metal nano-particles) whose surfaces are coated with a protective agent are obtained. The protective agent contains the aliphatic hydrocarbon monoamine (A) having 6 or more carbon atoms in total, the aliphatic hydrocarbon monoamine (B) having 5 or less carbon atoms in total, and the aliphatic hydrocarbon diamine (C) having 8 or less carbon atoms in total. Alternatively, the protective agent contains the aliphatic hydrocarbon monoamine (A) having 6 or more carbon atoms in total, the aliphatic hydrocarbon monoamine (B) having 5 or less carbon atoms in total, the aliphatic hydrocarbon diamine (C) having 8 or less carbon atoms in total, and the aliphatic carboxylic acid (D).

The prepared silver coating composition is applied onto a substrate and is then calcined.

The application can be performed by a known method such as spin coating, inkjet printing, screen printing, dispenser printing, relief printing (flexography), dye sublimation printing, offset printing, laser printer printing (toner printing), intaglio printing (gravure printing), contact printing, or microcontact printing. By using such a printing technique, a patterned silver coating composition layer is obtained, and a patterned silver conductive layer is obtained by calcining.

The calcining can be performed at 200° C. or less, for example, a room temperature (25° C.) or more and 150° C. or less, preferably a room temperature (25° C.) or more and 120° C. or less. However, in order to complete the sintering of silver by short-time calcining, the calcining may be performed at a temperature of 60° C. or more and 200° C. or less, for example, 80° C. or more and 150° C. or less, preferably 90° C. or more and 120° C. or less. The time of calcining may be appropriately determined in consideration of the amount of a silver ink applied, the calcining temperature, etc., and may be, for example, several hours (e.g., 3 hours, or 2 hours) or less, preferably 1 hour or less, more preferably 30 minutes or less, even more preferably 10 minutes to 20 minutes, more specifically 10 minutes to 15 minutes.

The silver nano-particles have such a constitution as described above, and are therefore sufficiently sintered even by such low-temperature and short-time calcining. As a result, excellent conductivity (low resistance value) is developed. A silver conductive layer having a low resistance value (e.g., 15 μΩcm or less, in the range of 7 to 15 μΩcm) is formed. The resistance value of bulk silver is 1.6 μΩcm.

Since the calcining can be performed at a low temperature, not only a glass substrate or a heat-resistant plastic substrate such as a polyimide-based film but also a general-purpose plastic substrate having low heat resistance, such as a polyester-based film, e.g., a polyethylene terephthalate (PET) film and a polyethylene naphthalate (PEN) film, or a polyolefin-based film, e.g., polypropylene film, can be suitably used as a substrate. Further, short-time calcining reduces the load on such a general-purpose plastic substrate having low heat resistance, and improves production efficiency.

The silver conductive material according to the present invention can be applied to electromagnetic wave control materials, circuit boards, antennas, radiator plates, liquid crystal displays, organic EL displays, field emission displays (FEDs), IC cards, IC tags, solar cells, LED devices, organic transistors, condensers (capacitors), electronic paper, flexible batteries, flexible sensors, membrane switches, touch panels, EMI shields, and the like.

The thickness of the silver conductive layer may be appropriately determined depending on the intended use. Particularly, the use of the silver nano-particles according to the present invention makes it possible, even when a silver conductive layer having a relatively large film thickness is formed, for the silver conductive layer to have high conductivity. The thickness of the silver conductive layer may be selected from the range of, for example, 5 nm to 10 μm, preferably 100 nm to 5 μm, more preferably 300 nm to 2 μm.

The present invention has been described above with reference mainly to silver nano-particles, but is applied also to a method for producing metal nano-particles containing a metal other than silver and said metal nano-particles.

EXAMPLES

Hereinafter, the present invention will be described more specifically with reference to examples, but is not limited to these examples.

[Specific Resistance Value of Calcined Silver Film]

The specific resistance value of an obtained calcined silver film was measured by a four-terminal method (Loresta GP MCP-T610). The measuring limit of this device is $10^7$ Ωcm.

Reagents used in Examples and Comparative Example are as follows:

N,N-Dimethyl-1,3-propanediamine (MW: 102.18):manufacturedby Tokyo Chemical Industry Co., Ltd.;

n-Butylamine (MW: 73.14): reagent manufactured by Tokyo Chemical Industry Co., Ltd.;

Hexylamine (MW: 101.19): reagent manufactured by Tokyo Chemical Industry Co., Ltd.;

Octylamine (MW: 129.25): reagent manufactured by Tokyo Chemical Industry Co., Ltd.;

Oleic acid (MW: 282.47): reagent manufactured by Tokyo Chemical Industry Co., Ltd.;

Silver oxalate (MW: 303.78): reagent manufactured by Tokyo Chemical Industry Co., Ltd.;

Methanol: special grade reagent manufactured by Wako Pure Chemical Industries, Ltd.;

1-Butanol: reagent manufactured by Tokyo Chemical Industry Co., Ltd.; and

Octane: special grade reagent manufactured by Wako Pure Chemical Industries, Ltd.

Example 1

(Preparation of Silver Nano-Particles)

1.28 g (12.5 mmol) of N,N-dimethyl-1,3-propanediamine, 0.91 g (12.5 mmol) of n-butylamine, 3.24 g (32.0 mmol) of hexylamine, 0.39 g (3.0 mmol) of octylamine, and 0.09 g (0.33 mmol) of oleic acid were added to a 50-mL flask and stirred at a room temperature to prepare a homogeneous amine-carboxylic acid mixture solution.

3.04 g (10 mmol) of silver oxalate was added to the prepared mixture solution and stirred at a room temperature to convert silver oxalate to a viscous white substance. The stirring was terminated when such conversion was seemingly completed. In this way, a silver oxalate-amine complex was formed.

Then, the obtained reaction mixture was heated to 105° C. to 110° C. with stirring. Right after the start of the stirring, a reaction accompanied by generation of carbon dioxide was started. Then, the stirring was continued until the generation of carbon dioxide was completed. As a result, a suspension was obtained in which shiny blue silver nano-particles were suspended in the amine-carboxylic acid mixture.

Then, 10 mL of methanol was added to the obtained suspension with stirring. Then, the silver nano-particles were spun down by centrifugation to remove a supernatant. Then, 10 mL of methanol was again added to the silver nano-particles with stirring, and then the silver nano-particles were spun down by centrifugation to remove a supernatant. In this way, wet silver nano-particles were obtained.

(Preparation and Calcining of Nano-Silver Coating Material)

Then, a 1-butanl/octane mixed solvent (volume ratio=1/4) was added to the wet silver nano-particles with stirring so that a silver concentration was 50 wt % to prepare a silver nano-particle dispersion liquid. The silver nano-particle dispersion liquid was applied onto an alkali-free glass plate by spin coating to form a coating film whose film thickness after calcining was about 1 μm.

After being formed, the coating film was immediately calcined in a fan drying oven at 120° C. for 15 minutes to form a calcined silver film having a thickness of about 1 μm. The specific resistance value of the obtained calcined silver film was measured by a four-terminal method and found to be 8.4 μΩcm.

Further, the initial dispersibility [1] and the storage stability [2] of the above described silver nano-particle dispersion liquid were evaluated in the following manner.

[1] The above described silver nano-particle dispersion liquid immediately after its preparation was filtered through a 0.2-μm filter. As a result, clogging of the filter did not occur. That is, the silver nano-particle dispersion liquid was kept in a state where the silver nano-particles were well dispersed.

[2] The above described silver nano-particle dispersion liquid immediately after its preparation was placed in a transparent glass sampling bottle, and the sampling bottle was hermetically sealed and then stored in a dark place at 25° C. for 7 days. As a result, a silver mirror was not observed. Further, the silver nano-particle dispersion liquid after the storage was filtered through a 0.2-μm filter. As a result, clogging of the filter did not occur. That is, the silver nano-particle dispersion liquid after the storage was kept in a state where the silver nano-particles were well dispersed.

(Regarding Silver Oxalate-Amine Complex)

The viscous white substance obtained in the process of preparing silver nano-particles was analyzed by a DSC (Differential Scanning calorimeter), and as a result, its average exothermic onset temperature by thermal decomposition was 102.5° C. On the other hand, silver oxalate as a starting material was also analyzed by a DSC similarly, and as a result, its average exothermic onset temperature by thermal decomposition was 218° C. That is, the viscous white substance obtained in the process of preparing silver nano-particles had a lower thermal decomposition temperature than silver oxalate as a starting material. The results indicate that the viscous white substance obtained in the process of preparing silver nano-particles was a material obtained by bonding between silver oxalate and the alkylamine, and the white substance was estimated to be a silver oxalate-amine complex in which the amino group of the alkylamine was coordinated to a silver atom in silver oxalate.

The DSC analysis was performed under the following conditions:

Device: DSC 6220-ASD2 (manufactured by SII Nanotechnology Inc.);

Sample container: 15-μL, gold-plated sealed cell (manufactured by SII Nanotechnology Inc.);

Temperature rise rate: 10° C./min (room temperature to 600° C.);

Atmosphere gas inside the cell: air filled at atmospheric pressure; and

Atmosphere gas outside the cell: nitrogen stream (50 mL/min).

In addition, the IR spectrum of the viscous white substance obtained in the process of preparing silver nano-particles was measured, and as a result, absorption derived from the alkyl group of the alkylamine was observed (at about 2,900 cm$^{-1}$ and about 1,000 cm$^{-1}$). The result also indicates that the viscous white substance obtained in the process of preparing silver nano-particles was a material obtained by bonding between silver oxalate and the alkylamine, and the white substance was estimated to be a silver oxalate-amine complex in which an amino group was coordinated to a silver atom in silver oxalate.

FIG. 1 is a transmission electron microscope (TEM) photograph (×100,000 magnifications) of the silver nano-particles obtained in Example 1. Spherical particles each having a particle size of about 5 to 20 nm were observed.

Example 2

A silver nano-particle dispersion liquid was prepared in the same manner as in Example 1 except that the composition of the amine-carboxylic acid mixture solution in preparation of silver nano-particles was changed as follows: 1.28 g (12.5 mmol) of N,N-dimethyl-1,3-propanediamine, 0.91 g (12.5 mmol) of n-butylamine, 3.24 g (32.0 mmol) of hexylamine, 0.39 g (3.0 mmol) of octylamine, and 0.13 g (0.45 mmol) of oleic acid. Then, a coating film was formed and calcined in the same manner as in Example 1.

The obtained calcined silver film had a film thickness of about 1 μm and a specific resistance value of 11.3 μΩcm.

[1] The above described silver nano-particle dispersion liquid immediately after its preparation was filtered through a 0.2-μm filter. As a result, clogging of the filter did not occur. That is, the silver nano-particle dispersion liquid was kept in a state where the silver nano-particles were well dispersed.

[2] The above described silver nano-particle dispersion liquid immediately after its preparation was placed in a transparent glass sampling bottle, and the sampling bottle was hermetically sealed and then stored in a dark place at 25° C. for 7 days. As a result, a silver mirror was not observed. Further, the silver nano-particle dispersion liquid after the storage was filtered through a 0.2-μm filter. As a result, clogging of the filter did not occur. That is, the silver nano-particle dispersion liquid after the storage was kept in a state where the silver nano-particles were well dispersed.

Further, the IR spectrum of the viscous white substance obtained in the process of preparing silver nano-particles was measured, and as a result, absorption derived from the alkyl group of the alkylamine was observed (at about 2,900cm$^{-1}$ and about 1,000 cm$^{-1}$) as in the case of Example 1.

Example 3

A silver nano-particle dispersion liquid was prepared in the same manner as in Example 1 except that the composition of the amine-carboxylic acid mixture solution in preparation of silver nano-particles was changed as follows: 1.53 g (15.0 mmol) of N,N-dimethyl-1,3-propanediamine, 0.73 g (10.0 mmol) of n-butylamine, 3.24 g (32.0 mmol) of hexylamine, 0.39 g (3.0 mmol) of octylamine, and 0.13 g (0.45 mmol) of oleic acid. Then, a coating film was formed and calcined in the same manner as in Example 1.

The obtained calcined silver film had a film thickness of about 1 μm and a specific resistance value of 14.2 μΩcm.

[1] The above described silver nano-particle dispersion liquid immediately after its preparation was filtered through a 0.2-μm filter. As a result, clogging of the filter did not occur. That is, the silver nano-particle dispersion liquid was kept in a state where the silver nano-particles were well dispersed.

[2] The above described silver nano-particle dispersion liquid immediately after its preparation was placed in a transparent glass sampling bottle, and the sampling bottle was hermetically sealed and then stored in a dark place at 25° C. for 7 days. As a result, a silver mirror was not observed. Further, the silver nano-particle dispersion liquid after the storage was filtered through a 0.2-μm filter. As a result, clogging of the filter did not occur. That is, the silver nano-particle dispersion liquid after the storage was kept in a state where the silver nano-particles were well dispersed.

Further, the IR spectrum of the viscous white substance obtained in the process of preparing silver nano-particles was measured, and as a result, absorption derived from the alkyl group of the alkylamine was observed (at about 2,900 cm$^{-1}$ and about 1,000 cm$^{-1}$) as in the case of Example 1.

Example 4

A silver nano-particle dispersion liquid was prepared in the same manner as in Example 1 except that the composition of the amine-carboxylic acid mixture solution in preparation of silver nano-particles was changed as follows: 1.02 g (10 mmol) of N,N-dimethyl-1,3-propanediamine, 1.10 g (15.0 mmol) of n-butylamine, 3.24 g (32.0 mmol) of hexylamine, 0.39 g (3.0 mmol) of octylamine, and 0.13 g (0.45 mmol) of oleic acid. Then, a coating film was formed and calcined in the same manner as in Example 1.

The obtained calcined silver film had a film thickness of about 1 μm and a specific resistance value of 14.5 μΩcm.

[1] The above described silver nano-particle dispersion liquid immediately after its preparation was filtered through a 0.2-μm filter. As a result, clogging of the filter did not occur. That is, the silver nano-particle dispersion liquid was kept in a state where the silver nano-particles were well dispersed.

[2] The above described silver nano-particle dispersion liquid immediately after its preparation was placed in a transparent glass sampling bottle, and the sampling bottle was hermetically sealed and then stored in a dark place at 25° C. for 7 days. As a result, a silver mirror was not observed. Further, the silver nano-particle dispersion liquid after the storage was filtered through a 0.2-μm filter. As a result, clogging of the filter did not occur. That is, the silver nano-particle dispersion liquid after the storage was kept in a state where the silver nano-particles were well dispersed.

Further, the IR spectrum of the viscous white substance obtained in the process of preparing silver nano-particles was measured, and as a result, absorption derived from the alkyl group of the alkylamine was observed (at about 2,900 cm$^{-1}$ and about 1,000 cm$^{-1}$) as in the case of Example 1.

Comparative Example 1

A silver nano-particle dispersion liquid was prepared in the same manner as in Example 1 except that the composition of the amine-carboxylic acid mixture solution in preparation of silver nano-particles was changed as follows: 2.55 g (25.0 mmol) of N,N-dimethyl-1,3-propanediamine, 3.24 g (32.0 mmol) of hexylamine, 0.39 g (3.0 mmol) of octylamine, and 0.13 g (0.45 mmol) of oleic acid. Then, the silver nano-particle dispersion liquid was applied to form each of coating films whose film thickness after calcining was about 0.35 μm, 0.65 μm, or 1 μm, and the each of coating films was calcined.

The specific resistance value of the obtained calcined silver film (film thickness: 0.35 μm) was measured and found to be about 200 μΩcm.

The specific resistance value of the obtained calcined silver film (film thickness: 0.65 μm) was measured and found to be about 200 μΩcm.

The specific resistance value of the obtained calcined silver film (film thickness: 1 μm) was measured and found to be about 2.0E+08 μΩcm.

[1] The above described silver nano-particle dispersion liquid immediately after its preparation was filtered through a 0.2-μm filter. As a result, clogging of the filter did not occur. That is, the silver nano-particle dispersion liquid was kept in a state where the silver nano-particles were well dispersed.

[2] The above described silver nano-particle dispersion liquid immediately after its preparation was placed in a transparent glass sampling bottle, and the sampling bottle was hermetically sealed and then stored in a dark place at 25° C. for 7 days. As a result, a silver mirror was not observed. Further, the silver nano-particle dispersion liquid after the storage was filtered through a 0.2-μm filter. As a result, clogging of the filter did not occur. That is, the silver nano-particle dispersion liquid after the storage was kept in a state where the silver nano-particles were well dispersed.

As described above, the silver nano-particles according to the examples have excellent dispersibility and storage stability in the dispersion liquid, and can impart excellent conductivity to a calcined silver film even when said calcined silver film having a relatively large thickness of, for example, 1 μm or more is formed by calcining at a low temperature.

The invention claimed is:

1. Coated silver nano-particles produced by a method comprising:
   (a) preparing an amine mixture liquid comprising:
      (i) an aliphatic hydrocarbon monoamine (A) comprising an aliphatic hydrocarbon group and one amino group, said aliphatic hydrocarbon group having 6 or more carbon atoms in total,
      (ii) an aliphatic hydrocarbon monoamine (B) comprising an aliphatic hydrocarbon group and one amino group, said aliphatic hydrocarbon group having 2 or more and 4 or less carbon atoms in total, and
      (iii) an aliphatic hydrocarbon diamine (C) comprising an aliphatic hydrocarbon group and two amino groups, said aliphatic hydrocarbon group having 7 or less carbon atoms in total wherein aliphatic hydrocarbon diamine (C) is represented by a structural formula:

$R^1R^2N-R-NH_2$ wherein R represents a bivalent ethylene or propylene group, $R^1$ and $R^2$ may be the same or different from each other and each represent a methyl or an ethyl group, and the total number of carbon atoms of R, $R^1$, and $R^2$ is 7 or less,
   (b) mixing a silver compound and the amine mixture liquid to form a complex compound comprising the silver compound and the amines; and
   (c) thermally decomposing the complex compound by heating to form coated silver nano-particles,
   wherein each of the aliphatic hydrocarbon amine (A), the aliphatic hydrocarbon amine (B), and the aliphatic hydrocarbon diamine (C) does not have, on its hydrocarbon group, a hetero atom, and
   wherein a surface of the coated silver nano-particles comprises a protective agent, comprising the aliphatic hydrocarbon monoamine (A), the aliphatic hydrocarbon monoamine (B) and the aliphatic hydrocarbon diamine (C).

2. The coated silver nano-particles according to claim 1, wherein the silver compound is silver oxalate.

3. The coated silver nano-particles according to claim 1, wherein the aliphatic hydrocarbon monoamine (A) is contained in the amine mixture liquid in step (a) in an amount of 10 mol % to 65 mol % of a total of the aliphatic hydrocarbon monoamine (A), the aliphatic hydrocarbon monoamine (B), and the aliphatic hydrocarbon diamine (C).

4. The coated silver nano-particles according to claim 1, wherein the aliphatic hydrocarbon monoamine (B) is contained in the amine mixture liquid in step (a) in an amount of 5 mol% to 50 mol % of a total of the aliphatic hydrocarbon monoamine (A), the aliphatic hydrocarbon monoamine (B), and the aliphatic hydrocarbon diamine (C).

5. The coated silver nano-particles according to claim 1, wherein the aliphatic hydrocarbon diamine (C) is contained in the amine mixture liquid in step (a) in an amount of 15 mol % to 50 mol % of a total of the aliphatic hydrocarbon monoamine (A), the aliphatic hydrocarbon monoamine (B), and the aliphatic hydrocarbon diamine (C).

6. The coated silver nano-particles according to claim 1, wherein the aliphatic hydrocarbon monoamine (A), the aliphatic hydrocarbon monoamine (B), and the aliphatic hydrocarbon diamine (C) are used in step (a) in a total amount of 1 to 20 moles per mole of silver atoms in the silver compound.

7. The coated silver nano-particles according to claim 1, wherein an aliphatic carboxylic acid (D) is added to the amine mixture liquid in step (a), and wherein the protective agent comprised on the surface of the coated silver nano-particles further comprises the aliphatic carboxylic acid (D).

8. A silver coating composition comprising the coated silver nano-particles of claim 1, and an organic solvent.

9. A silver coating composition comprising the coated silver nano-particles of claim 7, and an organic solvent.

10. The coated silver nano-particles according to claim 1, wherein the aliphatic hydrocarbon diamine (C) comprises an aliphatic hydrocarbon group and two amino groups, said aliphatic hydrocarbon group having 6 or less carbon atoms in total wherein aliphatic hydrocarbon diamine (C) is represented by a structural formula:

$R^1R^2N-R-NH_2$ wherein R represents a bivalent ethylene or propylene group, $R^1$ and $R^2$ may be the same or different from each other and each represent a methyl or an ethyl group, and the total number of carbon atoms of R, $R^1$, and $R^2$ is 6 or less.

11. A silver coating composition comprising the coated silver nano-particles of claim 10, and an organic solvent.

12. Coated silver nano-particles produced by a method comprising:
    (a) preparing a mixture liquid comprising:
    (i) an aliphatic hydrocarbon monoamine (A) comprising a saturated aliphatic hydrocarbon group and one primary amino group, said aliphatic hydrocarbon group having 6 or more and 18 or less carbon atoms in total,
    (ii) an aliphatic hydrocarbon monoamine (B) comprising an aliphatic hydrocarbon group and one primary amino group, said aliphatic hydrocarbon group having 3 or more and 4 or less carbon atoms in total, and
    (iii) an aliphatic hydrocarbon diamine (C) comprising an aliphatic hydrocarbon group and two amino groups, said aliphatic hydrocarbon group having 6 or less carbon atoms in total wherein aliphatic hydrocarbon diamine (C) is represented by a structural formula:

$R^1R^2N-R-NH_2$ wherein R represents a bivalent ethylene or propylene group, $R^1$ and $R^2$ may be the same or different from each other and each represent a methyl or an ethyl group, and the total number of carbon atoms of R, $R^1$, and $R^2$ is 6 or less,
    (iv) an aliphatic carboxylic acid (D) that is a saturated or unsaturated monocarboxylic acid having 8 to 18 carbon atoms;
    (b) mixing a silver compound and the mixture liquid to form a complex compound comprising the silver compound and the amines; and
    (c) thermally decomposing the complex compound by heating to form coated silver nano-particles,
    wherein each of the aliphatic hydrocarbon amine (A), the aliphatic hydrocarbon amine (B), and the aliphatic hydrocarbon diamine (C) does not have, on its hydrocarbon group, a hetero atom, and
    wherein a surface of the coated silver nano-particles comprises a protective agent, comprising the aliphatic hydrocarbon monoamine (A), the aliphatic hydrocarbon monoamine (B), the aliphatic hydrocarbon diamine (C) and the aliphatic carboxylic acid (D).

* * * * *